United States Patent
Keser et al.

(10) Patent No.: US 10,365,329 B2
(45) Date of Patent: Jul. 30, 2019

(54) MEASUREMENTS IN SWITCH DEVICES

(71) Applicant: Infineon Technologies AG, Neubiberg (DE)

(72) Inventors: Goran Keser, Munich (DE); Veli Kartal, Munich (DE)

(73) Assignee: Infineon Technologies AG, Neubiberg (DE)

( * ) Notice: Subject to any disclaimer, the term of this patent is extended or adjusted under 35 U.S.C. 154(b) by 41 days.

(21) Appl. No.: 15/166,075

(22) Filed: May 26, 2016

(65) Prior Publication Data
US 2017/0343608 A1 Nov. 30, 2017

(51) Int. Cl.
| G01R 31/44 | (2006.01) |
| H03K 17/08 | (2006.01) |
| G01R 19/165 | (2006.01) |
| G01R 15/20 | (2006.01) |
| G01R 19/00 | (2006.01) |
| G01R 31/327 | (2006.01) |

(52) U.S. Cl.
CPC ....... *G01R 31/3274* (2013.01); *G01R 15/205* (2013.01); *G01R 15/207* (2013.01); *G01R 19/0084* (2013.01); *G01R 19/165* (2013.01); *G01R 31/44* (2013.01); *H03K 17/08* (2013.01); *G01R 31/3277* (2013.01); *H03K 2217/0027* (2013.01)

(58) Field of Classification Search
CPC .............. G01R 31/3274; G01R 15/205; G01R 19/0084; G01R 15/207
See application file for complete search history.

(56) References Cited

U.S. PATENT DOCUMENTS

| 5,966,008 | A | * | 10/1999 | Maier | ................ | G01R 15/183 |
| | | | | | | 324/117 R |
| 6,040,688 | A | * | 3/2000 | Strubin | ............... | G01R 15/207 |
| | | | | | | 323/229 |
| 6,316,967 | B1 | | 11/2001 | Takagi et al. | | |
| 8,854,065 | B2 | | 10/2014 | Mauder et al. | | |
| 9,322,887 | B1 | * | 4/2016 | Eagen | ............... | G01R 33/0082 |
| 9,709,640 | B2 | * | 7/2017 | Chang | ................... | G01R 33/09 |
| 2004/0207268 | A1 | * | 10/2004 | Muth | .................... | G01R 33/09 |
| | | | | | | 307/413 |
| 2005/0077890 | A1 | * | 4/2005 | Rannow | ................ | G01K 7/36 |
| | | | | | | 324/117 R |
| 2009/0001965 | A1 | * | 1/2009 | Ausserlechner | ...... | G01D 5/145 |
| | | | | | | 324/202 |

(Continued)

FOREIGN PATENT DOCUMENTS

| CN | 101629973 A | 1/2010 |
| CN | 103080755 A | 5/2013 |

(Continued)

OTHER PUBLICATIONS

Office Action, in the Chinese language, from counterpart Chinese Application No. 201710418307.7, dated May 24, 2019, 8 pp.

*Primary Examiner* — Son T Le
*Assistant Examiner* — Akm Zakaria
(74) *Attorney, Agent, or Firm* — Shumaker & Sieffert, P.A.

(57) ABSTRACT

Magnetoresistive sensors are used to measure a load current of a switch. In some implementations, additionally a further current sensor may be used. In other implementations, more than one magnetoresistive sensor may be provided.

20 Claims, 6 Drawing Sheets

(56) References Cited

U.S. PATENT DOCUMENTS

| | | | | |
|---|---|---|---|---|
| 2013/0099779 A1* | 4/2013 | Holman, Jr. | ......... | G01R 15/205 |
| | | | | 324/228 |
| 2013/0154631 A1* | 6/2013 | Tamura | ................ | G01R 15/207 |
| | | | | 324/226 |
| 2013/0187645 A1* | 7/2013 | Pannetier-Lecoeur | ....................... | |
| | | | | G01R 15/205 |
| | | | | 324/252 |
| 2016/0109524 A1* | 4/2016 | Butzmann | ............ | G01R 15/205 |
| | | | | 429/61 |
| 2016/0172898 A1* | 6/2016 | Willemin | .............. | H02M 3/156 |
| | | | | 320/101 |
| 2016/0200213 A1* | 7/2016 | Wolf | .................. | B60L 11/1864 |
| | | | | 701/22 |

FOREIGN PATENT DOCUMENTS

| | | |
|---|---|---|
| CN | 103134967 A | 6/2013 |
| CN | 103207303 A | 7/2013 |
| CN | 105452881 A | 3/2016 |
| JP | 2001345686 A | 12/2001 |
| WO | 2006136577 A1 | 12/2006 |
| WO | 2016136577 A1 | 12/2006 |

* cited by examiner

MEASUREMENTS IN SWITCH DEVICES

TECHNICAL FIELD

The present application relates to devices and methods associated with performing measurements in switch devices.

BACKGROUND

Switch devices are used in many applications to selectively provide electrical connections. In many cases, transistors are used as switches in such switch devices.

In many applications, for example for monitoring and/or diagnosis purposes, it is desirable or even required to perform measurements on the switch device, e.g. to monitor operation thereof. Typical measurements include for example current measurements measuring a load current through the switch device, voltage measurements measuring a voltage across the switch device or temperature measurements measuring a temperature of the switch device. This may for example be important in safety-critical applications to be able to detect an overcurrent, an overvoltage or an over-temperature and to take counter measures (like opening the switch) to avoid for example damages to the switch device due to such conditions.

Various approaches for current measurement are conventionally used in switch devices. For example, in some cases a shunt resistor has been used for current measurements. However, current measurements using a shunt resistor are comparatively expensive, as such a resistor needs to be designed for high currents requiring corresponding area on a chip and on the other hand the resistor has to be very precise (low tolerance regarding its resistance value) to enable an exact measurement. In particular, for switch devices switching a large range of currents (for example from some milliamperes up to some tens Ampere or more) designing and manufacturing a shunt resistor is a challenge for actual implementations. Moreover, the voltage drop over typical shunt resistors is usually quite low even for high currents (for example some microvolts), which makes measuring more difficult.

In other switch devices, a sense transistor is provided which may for example be coupled in a current mirror configuration to an actual switch transistor. Such sense transistors are a comparatively cheap solution for current measurements. However, with such sense resistors Measuring small currents may be a challenge due to a low voltage drop.

Yet other approaches measure a voltage between load terminals of the switch device as an indirect current measurement, for example between source and drain terminals of a switch transistor, which, however, creates similar challenges as the ones mentioned above. Furthermore, comparators or operational amplifiers are needed to evaluate a large voltage range.

Such comparator/operational amplifiers are also needed for measuring the voltage drop across typical switch devices, in particular when the switch devices are used for a large range of common mode voltages.

For temperature measurements, sometimes it is difficult to place a temperature sensor close enough to the switch device to provide precise temperature measurements.

DETAILED DESCRIPTION

In the following, various embodiments will be described referring to the attached drawings. These embodiments are provided by way of example only and are not to be construed as limiting. For example, while embodiments may be described as including various features (for example components, elements, details, operations etc.), in other embodiments some of these features may be omitted, and/or may be replaced by alternative features. Furthermore, in addition to the features explicitly described herein and shown in the drawings, other features may be provided, for example features conventionally used for switch devices.

Features from different embodiments may be combined with each other to form further embodiments unless noted otherwise. Variations and modifications described with respect to one of the embodiments may also be applicable to other embodiments.

Any direct connections or couplings between elements, i.e. connections or couplings without additional intervening elements (for example simple metal connections) may be replaced by indirect connections or couplings, i.e. connections or couplings comprising one or more intervening elements, and vice versa, as long as the general purpose of the connection or coupling, for example to transmit a certain kind of signal, to transmit a certain kind of information or to provide a certain kind of control, is essentially maintained.

In some embodiments, switch devices are provided comprising one or more switches. Switches and switch devices are generally described as comprising a control terminal and at least a first and a second load terminal. Depending on a signal provided to the control terminal, the switch provides a low ohmic connection between the first and second load terminals, such that current may flow, or a high ohmic decoupling between the load terminals, such that essentially no current may flow (apart from possible usually undesired leakage currents). The low ohmic connection state described above is referred to as a closed or on state of the switch or switch device herein, and the high ohmic state is referred to as an open or off state of the switch or switch device herein.

In various embodiments, switches may be implemented as transistors. In case of a field effect transistor (FET) like a metal oxide semiconductor effect transistor (MOSFET), the first and second load terminals correspond to the source and drain terminals, and the control terminal corresponds to the gate terminal. In case of an insulated gate bipolar transistor (IGBT), the first and second load terminals correspond again to source and drain terminals, and the control terminal corresponds to a base terminal. In case of a bipolar transistor, the first and the second load terminals correspond to collector and emitter terminals, and the control terminal corresponds to the base terminal. Unless noted otherwise, embodiments may be implemented using various kinds of transistors.

In some embodiments, magnetoresistive sensors are used for performing measurements in switch devices. Magnetoresistive sensors use magnetoresistive effects which change a resistance depending on a magnetic field. The magnetic field may be generated by a current flowing through the switch, in particular between the load terminals of the switch.

Several magnetoresistive effects may be used to implement magnetoresistive resistors and sensors. Examples include anisotropic magnetoresistance (AMR), giant magnetoresistance (GMR), colossal magnetoresistance (CMR) or tunneling magnetoresistance (TMR), jointly referred to as XMR herein. Implementation of magnetoresistive elements based on these effects per se is a conventional technique and will not be described in detail. In general, to implement such magnetoresistive elements several layers of ferromagnetic, antiferromagnetic and/or dielectric materials are deposited on a substrate, one or more layers may be magnetized to serve as reference layers, and contacts are provided to be able to measure the resistance of these elements in response to an applied magnetic field.

In some embodiments, magnetoresistive elements may be arranged in a bridge circuit configuration to provide a sensor like a current sensor. However, also other arrangements of magnetoresistive elements are within the scope of the present application.

Figure 1:
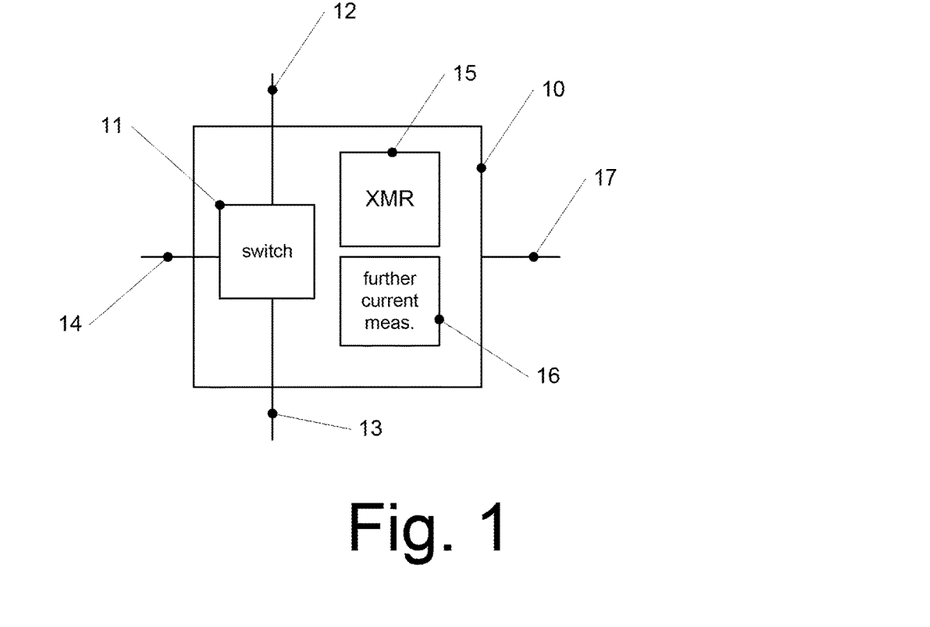
FIG. 1 is a block diagram of a switch device according to an embodiment.

Turning now to the figures, FIG. 1 illustrates a block diagram of a switch device 10 according to an embodiment.

Switch device 10 of FIG. 1 comprises a switch 11 having a control terminal 14, a first load terminal 12 and a second load terminal 13. In operation, for example one of load terminals 12, 13 may be coupled to a supply voltage or to a reference potential, while the other one of load terminals 12, 13 may be coupled to a load, to selectively couple the load with the supply voltage or reference potential. In other applications, both load terminals 12, 13 may be coupled to loads to selectively provide a connection between the loads. Operation of the switch is controlled via control terminal 14. Switch 11 may be implemented using a transistor as explained above.

Switch device 10 further comprises an XMR current sensor 15 arranged to sense a current flowing via switch 11, for example a current flowing between load terminals 12 and 13. A current flowing generates a magnetic field, which in turn may be sensed by XMR sensor 15. In some embodiments, XMR sensor 15 may comprise magnetoresistive elements arranged in a bridge configuration, as will be explained later in greater detail. In other embodiments, XMR sensor 15 may be used to measure a voltage across switch 11 by applying a predefined current.

Furthermore, switch device 10 comprises a further current measurement 16, which uses a different measuring technique than XMR sensor 15 to measure the current flowing via switch 11. For example, a conventional sense transistor in a current mirror configuration or a measurement via a shunt resistor may be used. Providing further current measurement 16 provides redundancy to the current measurement, i.e. if one current measurement 15, 16 fails, there is still the other. In addition, in the embodiment of FIG. 1 so-called diversity is provided, i.e. different techniques are used for current measurements. Both redundancy and diversity may help to fulfill functional safety requirements, for example ASIL (automotive safety integrity level) requirements. For example, functional safety requirements are defined in ISO 26262.

In embodiments, similar to conventional approaches, when for example an overcurrent is detected using XMR sensor 15 and/or further current measurement 16, emergency measures may be taken like opening switch 11.

Furthermore, in some embodiments XMR sensor 15 in addition may be used for temperature measurements by using a temperature dependency of magnetoresistive elements of XMR sensor 15. In addition, voltage measurements may be provided.

In some embodiments, using XMR sensor 15 a "lifetime" monitoring of switch 11 may be provided, for example slow deteriorations/degradations of switch 11 may be detected, such that switch 11 or switch device 10 may be replaced before a failure becomes likely. This will be explained further below in some more details. Before explaining such details, some further embodiments will be described referring to FIGS. 2 and 3.

Results of the current measurements by XMR sensor 15 and/or further current measurement 16 may be output via a diagnosis output 17 in some embodiments for use by other circuits or devices. In some embodiments, a measure of the measured current may be output. In other embodiments, a flag may be output in case an erroneous state is detected, for example an overcurrent. In this case, an evaluation logic circuit or a microcontroller may be provided in switch device 10 to perform such evaluation.

Figure 2:
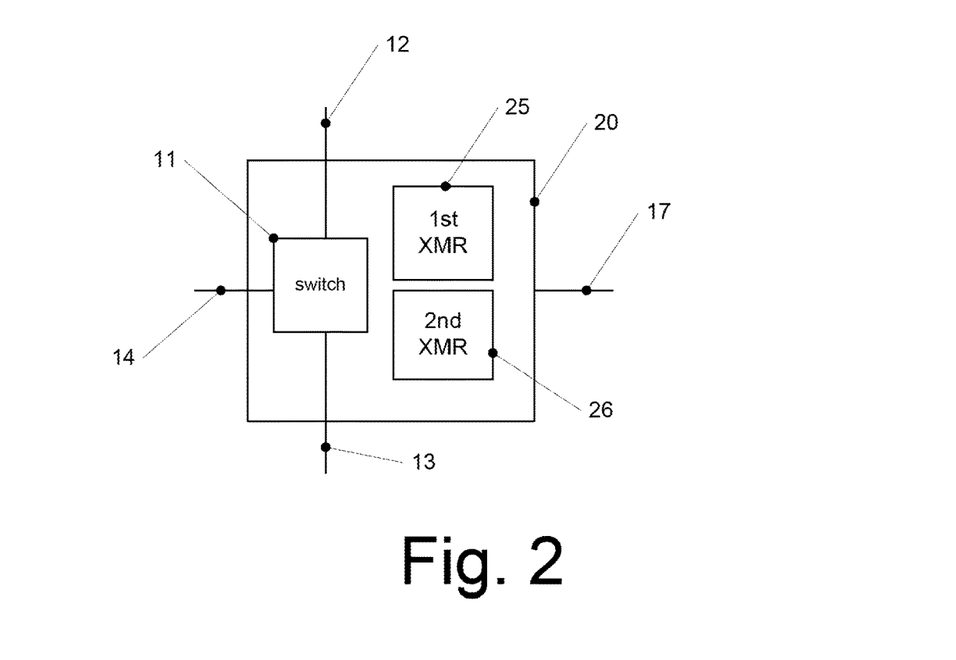
FIG. 2 is block diagram of a switch device according to a further embodiment.
Figure 3:
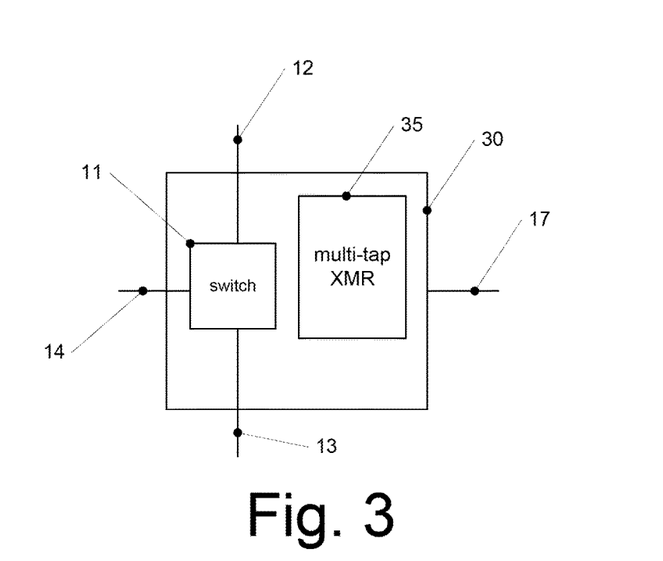
FIG. 3 is a block diagram of a switch device according to a further embodiment.

In FIGS. 2 and 3, to avoid repetitions, elements already explained with reference to FIG. 1 bear the same reference numerals as in FIG. 1 and will not be described again in detail. In particular, also the embodiments of FIGS. 2 and 3 comprise a switch 11 having terminals 12, 13 and 14 as well as a diagnosis output 17.

FIG. 2 illustrates a switch device 20 according to a further embodiment. Switch device 20 comprises a first XMR sensor for measuring a current flowing via switch 11 and a second XMR sensor for measuring a current flowing via switch 11. First XMR sensor 25 and second XMR sensor 26 may be designed for different measurement ranges. For example, first XMR sensor 25 may be designed to measure currents below a first threshold, and second XMR sensor 26 may be designed to measure currents above a second threshold, which may be the same as the first threshold or different therefrom. By using different thresholds, toggling between measurement ranges in case a current is close to a transition point between the two measurement ranges of first and second XMR sensors 25, 26 may be avoided.

In some embodiments, as shown in FIG. 3, first XMR sensor 25 and second XMR sensor 26 may be implemented as separate sensors. To provide different measurement ranges, for example different magnetoresistive elements having different resistance values may be used. In other embodiments, a single XMR sensor may be provided, and switching between measuring ranges may be performed using different bias currents or bias voltages for the XMR sensor. Similar to what was explained for switch device 10 of FIG. 1, current measurements by XMR sensors 25, 26 may be used to detect undesired condition like overcurrent conditions or overtemperature conditions, to take appropriate counter measures and/or to output corresponding signals via diagnosis output 17.

FIG. 3 illustrates a switch device 30 according to a further embodiment. Switch device 30 comprises a switch 11 as explained above and a multi-tap XMR sensor 35. A multi-tap XMR sensor is a sensor where an output may be tapped at different locations, for example to provide different offsets or to measure against different reference potentials. With such multi-tap XMR sensors in some embodiments also an accuracy may be improved.

It should be noted that the embodiments of FIGS. 1-3 may be combined in numerous ways. For example, a further current measurement as further current measurement 16 of FIG. 1 may also be provided in the switch devices of FIGS. 2 and 3, or XMR sensors 15, 25 and/or 26 may be implemented as multi-tap XMR sensors as multi-tap XMR sensor 35 of FIG. 3. Therefore, while the various techniques and features presented with respect to FIGS. 1-3 may be used independently from each other, they may also be implemented in combination. Furthermore, the techniques described above herein may not only be applied to single switches, but also to circuits comprising a plurality of switches. For example, in embodiments a plurality of switches may be provided in a full bridge or half bridge configurations. Sensors like the XMR sensors mentioned above e.g. for current sensing may be provided for one, some or all of the sensors of such a plurality of sensors.

Therefore, in the context of this application the indefinite article "a" (e.g. a switch, a sensor) is not to be construed as limiting to a single one, but is to be understood in the sense of "one or more".

Examples for the various features explained with reference to FIGS. 1-3 will be explained further below in more detail.

Figure 4A:
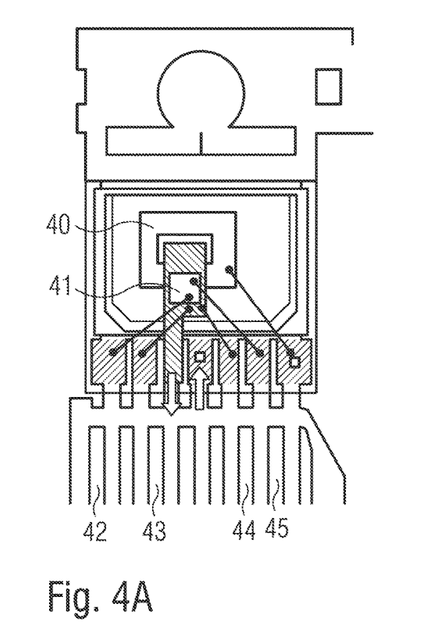
FIG. 4A is a top view of an implementation example of a switch device according to an embodiment.
Figure 4B:
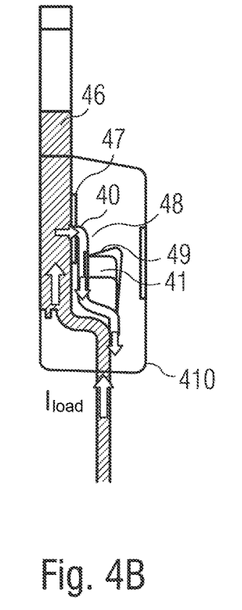
FIG. 4B is a side view of the switch device of FIG. 4A.

Switch devices 10-30 may be implemented as integrated devices, with the switch and XMR sensor(s) and/or possible further current measurements being implemented on a same chip. In other embodiments, they may be integrated in a single package, but using separate chip dies. An example for integration of an XMR sensor with a switch is illustrated in FIGS. 4A and 4B. In the example of FIGS. 4A and 4B, an AMR sensor is provided on a MOSFET. FIG. 4A illustrates a top view, whereas FIG. 46 illustrates a cross-sectional side view.

The device illustrated in FIGS. 4A and 4B comprises in particular an AMR sensor 41 mounted on a MOSFET chip 40. As seen in the side view of FIG. 4B, MOSFET 40 is fixed to a copper rail 46 using glue 47. A copper clip 48 is provided which carries the drain source current of the MOSFET, i.e. the load current, by being coupled to drain or source of the MOSFET. AMR sensor 41 is mounted to copper clip 48 using insulating glue 49. By mounting AMR sensor 41 on copper clip 48, a good sensing of a load current flowing through copper clip 48 may be provided. The load current is designated $I_{load}$ in FIG. 4B.

In the embodiment of FIG. 4, AMR sensor 41 is a differential sensor. For example, AMR sensor 41 may be coupled to pins 42-45 via bond wires. Pins 44, 45 may be for example used for biasing (for example by providing ground a positive supply voltage like VDD, respectively), and pins 42 and 43 may be used as differential taps for AMR sensor 41. In some embodiments, such a differential sensor may be implemented as a bridge configuration, as will be explained later. Differential sensing in some embodiments may reduce an impact of external stray fields.

Figure 4C:
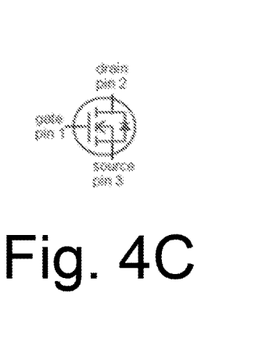
FIG. 4C is a circuit diagram symbol for the switch device of FIGS. 4A and 4B.

Other pins of the device may be used for contacting MOSFET 40, as shown in the circuit diagram symbol of FIG. 4, where a first pin is coupled to gate, a second pin is coupled to the drain, and a third pin is coupled to source.

The components of FIGS. 4A, 4B are provided in a package 410. In other embodiments, AMR sensor 41 may be integrated with MOSFET 40 in a single chip. The arrangement of FIG. 4 serves merely as an example.

Package 410 is merely an example, and generally XMR sensors as disclosed herein may be integrated with conventional integrated circuit technology, for example integrated in a package.

Next, possible implementations of the various features and techniques illustrated with respect to FIGS. 1-3 will be given using more detailed circuit diagrams. These circuit diagrams are merely example implementations, and other implementations are equally possible.

Figure 5:
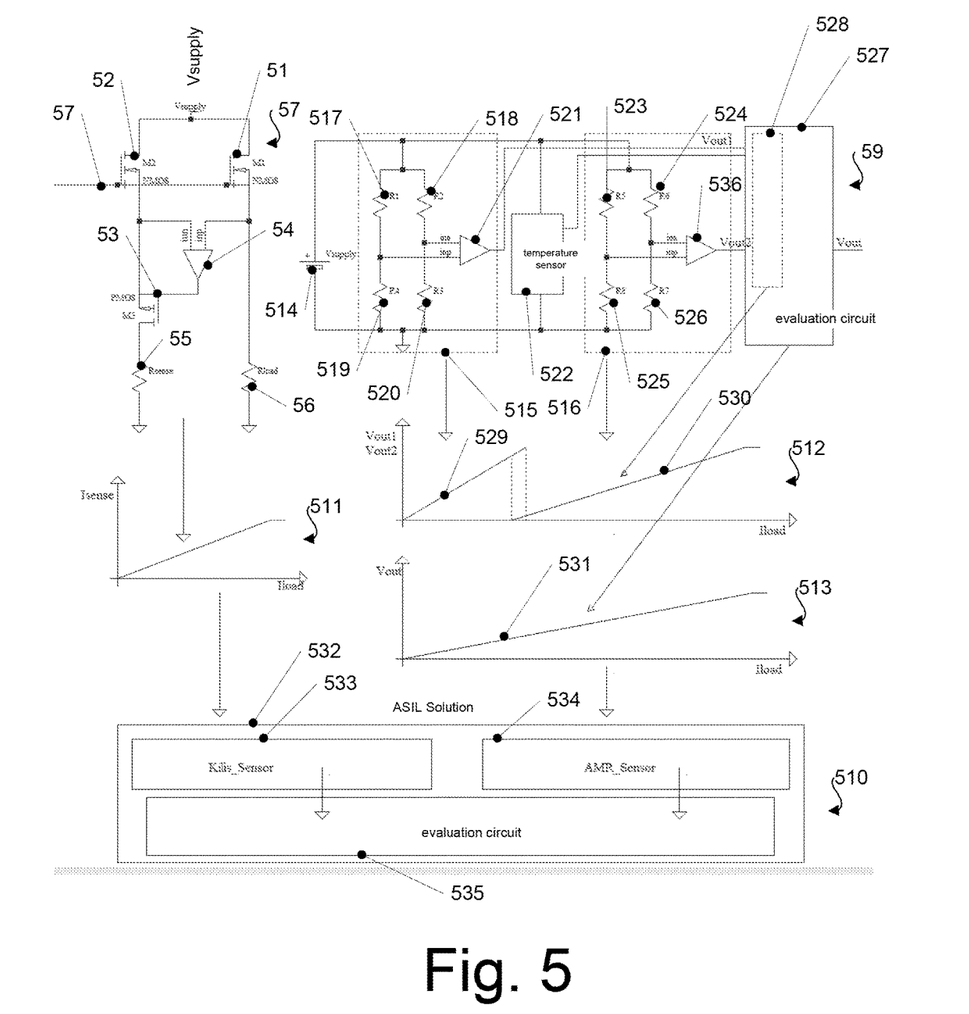
FIG. 5 is a detailed diagram illustrating a switch device according to an embodiment.

In FIG. 5, numeral 57 generally designates a circuit portion comprising a switch transistor 51 together with a current measurement using a current sense transistor 52. Numeral 59 generally designates a circuit portion comprising two XMR sensors 515, 516 and a temperature sensor 522. Numeral 510 generally designates a block diagram of a device 532 according to an embodiment. Numerals 511, 512 and 513 generally designate diagrams including example signals for further illustration.

As already mentioned, circuit portion 57 includes switch transistor 51. In the example of FIG. 5, switch transistor 51 is controlled via a gate line 57 and is coupled with its load terminals (source and drain) between a supply voltage Vsupply and a load 56 to selectively couple load 56 to supply voltage Vsupply. Therefore, in the example of FIG. 5, switch transistor 51 serves as a high side switch. In other embodiments, switch devices may be used as low side switches (for example between ground and a load) or as switches between circuit portions.

Furthermore, circuit portion 57 comprises a sense transistor 52. Sense transistor 52 is also controlled via gate line 57 and may be designed corresponding to switch transistor 51, but with smaller dimension, such that when switched on switch transistor 52 conducts a current proportional by a s called Kills factor to the load current through switch transistor 51. For regulation, load terminals of transistors 52, 51 as shown are coupled to inputs of a differential amplifier 54, an output of differential amplifier 54 controlling a transistor 53 coupled in series to transistor 52. Further coupled in series to transistors 52, 53 is a sense resistor 55. At sense resistor 55, a voltage may be tapped which is proportional to the load current of switch transistor 51.

Numeral 511 generally denotes a graph showing an example measurement curves, where resistor sense current through transistor 52 which leads to a corresponding voltage drop over sense resistor 55 is plotted over the load current of switch transistor 51.

The current measurement via transistors 52, 53, differential amplifier 54 and resistor 55 or other kinds of current mirror arrangements in some embodiments may be used for currents of different magnitude, e.g. comparatively small currents (e.g. mA), but also larger currents of e.g. some 100 of Amperes until short circuit detection including overload.

Furthermore, for current measurement XMR sensors 515, 516 are provided. These sensors may for example be provided on a copper rail or other conductor carrying the load current of switch transistor 51, as explained referring to FIG. 5.

XMR sensors 515, 516 are each configured as a bridge circuit (wheatstone bridge) comprising four magnetoresistive elements, which change their resistance depending on a magnetic field generated by the load current. XMR sensor 515 comprises magnetoresistive elements 517 to 520 coupled as shown in FIG. 5, and XMR sensor 516 comprises magnetoresistive elements 523 to 526 coupled as shown in FIG. 5. Sensors 515, 516 are biased by a supply voltage 514. Sensor 515 further comprises a differential amplifier 521 tapping nodes between resistors 517, 519 and between resistors 518, 520, and sensor 516 comprises a differential amplifier 536 tapping nodes between magnetoresistive elements 523, 524 and between magnetoresistive elements 525, 526. The magnetoresistive elements of sensors 515, 516 may be any kind of magnetoresistive elements, for example AMR, TMR, GMP. etc.

Outputs of differential amplifiers 521, 536 are provided to an evaluation circuit 527, which receives the signals and outputs an output signal in response to the signal. The output signal may for example comprise an alarm signal if sensor 515 or 516 indicates an overcurrent or other fault condition, or may comprise a signal indicating the magnitude of the load current.

Furthermore, circuit part 59 comprises a temperature sensor 522 to measure a temperature of switch 51 and to also output a result to evaluation circuit 527. Evaluation circuit 527 may use the measured temperature to determine for example an overtemperature condition. In other embodiments, temperature sensor 522 may be omitted, and the temperature may be measured via sensors 515, 516 using a temperature dependence of the magnetoresistive elements.

In the embodiment of FIG. 5, the magnetoresistive elements of sensor 515 may have different resistance values than the magnetoresistive elements of sensor 516, to provide different measurement ranges. In other embodiments, different supplies may be used for sensors 515, 516, for example different biasing voltages, to provide different measurement ranges. In still other embodiments, a single sensor 515 may be used which selectively may be provided with different biasing voltages or currents. Measuring of different ranges using sensors 515, 516 will be explained with reference to graphs 512 and 513.

Graph 512 shows example voltages Vout1, Vout2 of sensors 515, 516, respectively, over the load current through switch transistor 51. In the example, for low currents, sensor 515 exhibits a linear response (curve 529), and for high current sensor 516 exhibits a linear response (curve 530). In a region marked by dashed lines, both sensors may be used, and in this region a switchover is performed by an evaluation circuit 527. A switchover circuit 528 of evaluation circuit 527, depending on the thresholds indicated by dashed lines in graph 512, performs a switchover and for example multiplies curve 529 and/or 530 by a scaling factor to merge the curves, such that evaluation circuit 527 outputs a linear curve 531 over the whole measurement range as shown in graph 513. In this way, a large measurement range may be covered.

510 is a block diagram of a device 532 according to an embodiment comprising components discussed above. In particular, the device comprises a sensor as illustrated at 57, also referred to as Kilis sensor, which operates based on a sense transistor like sense transistor 52, and an XMR sensor 534, for example an AMR sensor or other XMR sensor, which may be configured as circuit part 59 of FIG. 5. An evaluation circuit 5.35 evaluates the outputs of Kills sensor 533 and AMR sensor 534 and takes corresponding measures, for example in case of overcurrent an opening of switch 51. Furthermore, evaluation circuit 535 may also detect inconsistencies between the outputs of sensors 533 and 534, for example only one sensor measuring a current, which also may lead to some kind of an alarm signal or emergency opening of switch transistor 51. In this way, redundancy and diversity is provided. As already mentioned with respect to FIGS. 1-3, in other embodiments some of the elements of FIG. 5 may be omitted. For example, in some embodiments the Kilis sensor may be provided, and in other embodiments only one XMR sensor may be provided.

Figure 6A:
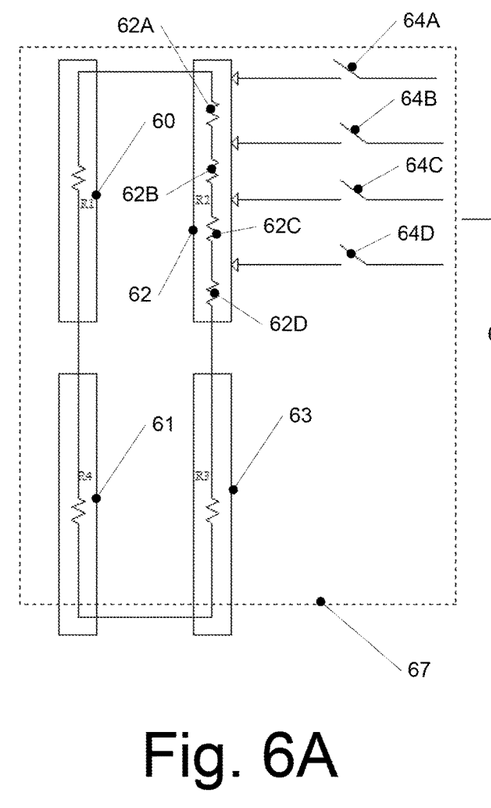
FIGS. 6A and 6B are representations illustrating magnetoresistive sensor bridge according to some embodiments.
Figure 6B:
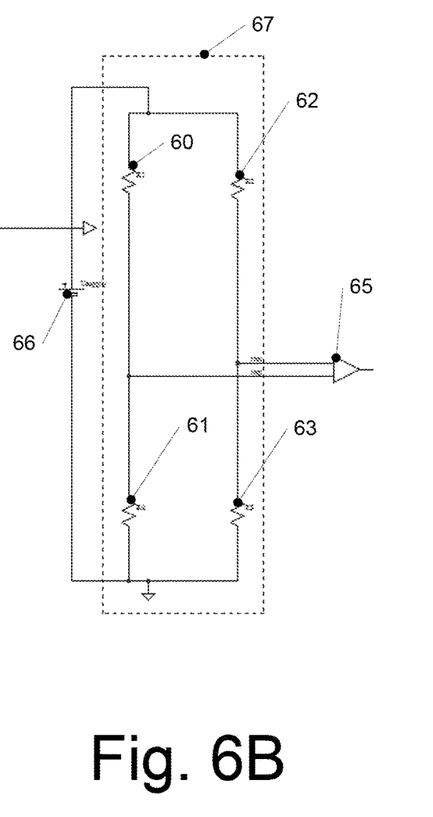

Furthermore, in some embodiments a tappable XMR sensor is provided. This will be explained next referring to FIG. 6.

As already mentioned with respect to FIG. 3, XMR sensors in embodiments may be implemented as multi-tap XMR sensors. For example, each of sensors 515, 516 of FIG. 5 may be implemented as such a multi-tap sensor. An example for a multi-tap sensor will now be discussed with reference to FIGS. 6A and 6B.

FIG. 6B is a view of an XMR sensor usable in embodiments comprising a sensor bridge 67 having magnetoresistive elements 60, 61, 62 and 63. FIG. 6A is a more detailed view of bridge 67 to explain multi-taps.

Bridge 67 of FIGS. 6A, 6B is supplied by a bias voltage 66. Nodes between magnetoresistive elements 60, 61 and between magnetoresistive elements 62, 63 are coupled to inputs of a differential amplifier 65, which outputs an output signal of the sensor which is a measure of a current flowing through a conductor (for example the copper clip mentioned with respect to FIG. 4) arranged in proximity to the sensor.

In the more detailed view of FIG. 6A, it can be seen that magnetoresistive element 62 is partitioned into four magnetoresistive elements 62A to 62D. The number of four serves only as an example here, and other numbers may be provided. Using switches 64A to 64D selectively nodes between the subcomponents 62A to 62D or between subcomponent 62A and resistor 60 may be tapped to be coupled to amplifier 65. In this way, different offsets may be provided for the measurements. The different tapping may for example be performed also in an alternating manner, and the results obtained may be combined to increase accuracy of the measurement. Also, by selecting an appropriate tap, a desired offset may be provided, which may for example be helpful for measuring small currents. The variable tapping may also be used for calibration purposes. In some embodiments, switches 64A to 64D may be implemented as fuses, and one of the switches may then be permanently closed while the others remain permanently open e.g. in a calibration process.

By providing an XMR sensor for current measurement, a galvanic separation is provided. Furthermore, the current measurement may be performed for currents in both directions (for example from first terminal to the second load terminal of the switch or from the second load terminal to the first terminal of the switch). In some embodiments, switches 64A to 64D may also be implemented as fuses and may be used to compensate different currents in both bridge branches (60, 61 on the one hand and 62, 63 on the other hand) at a load current of zero, fox example in a calibration.

By providing a multi-tap as in FIG. 6A, in an off state of the switch without load current various voltages may be checked, for example a positive supply voltage like VCC or VDD via 64A, half this voltage are ground by using other taps. Therefore, the supply voltage may be checked as an additional safety measure in a state without current, where the resistance values of the resistors are known.

As mentioned, while a temperature sensor is provided in other embodiments, such a temperature sensor may be omitted, and temperature may be measured using XMR sensors and their known temperature behavior, for example in a state with no load current on open state.

It should be noted that the XMR sensors discussed above may not only be used to measure a current, but also may be used to measure a voltage drop across the resistor.

For a voltage measurement using an XMR sensor, a predetermined constant current may be applied to the switch (e.g. switch transistor), for example using a conventional constant current source, like a temperature-compensated constant current source. The resistance of magnetoresistive elements like the ones discussed above then varies with the voltage across the switch, for example in an inversely proportional manner, which may be detected at the sensor output.

By a voltage measurement, for example a conventional voltage measurement or a voltage measurement by the XMR sensor, various cases may be distinguished. For example, in an off state, no current flows, but the full voltage drops over the switch. Other embodiments may provide detection of an open load. This will be explained with reference to FIG. 7.

Figure 7:
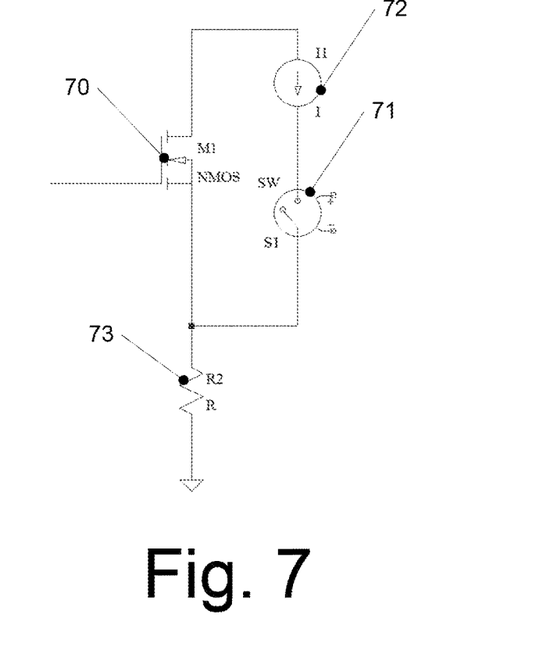
FIG. 7 is a diagram illustrating an open load.

In FIG. 7, a MOSFET switch 70 coupled to a load 73 is provided. In an open state of switch 70, as long a load 73 has a finite resistance, essentially a complete supply voltage drops over switch 70. A case of a disconnected (open) load may be seen as a high ohmic state of resistor 73.

To detect/evaluate such a state, in embodiments a current source 72 supplying a small current, e.g. in the range of 10 . . . 100 mA is provided. For detection, a switch 71 is closed. An open load then leads to a high voltage drop caused by this current, which may be detected, thus detecting the open load state. Furthermore, in embodiments a drain source voltage may be measured. Also, by detecting a current flow an on state of the switch may be detected.

By monitoring the voltage, and/or the current, in embodiments the threshold voltage of the switch may be monitored. By monitoring the threshold voltage or also source-gate voltage and source-drain voltage of a switch transistor over time, an aging or other temporal behavior (drift) of the switch may evaluated, and for example a lifetime and a future drift behavior may be predicted. For example, when the threshold voltage increases, the voltage drop over the switch increases in normal operation, which may be monitored. This in some embodiments may enable early detection that a switch should be replaced prior to actual failure of the switch. In other embodiments, another property of the switch like an on resistance may be monitored.

Such diagnosis functions may for example help to fulfill functional safety requirements.

Figure 8:
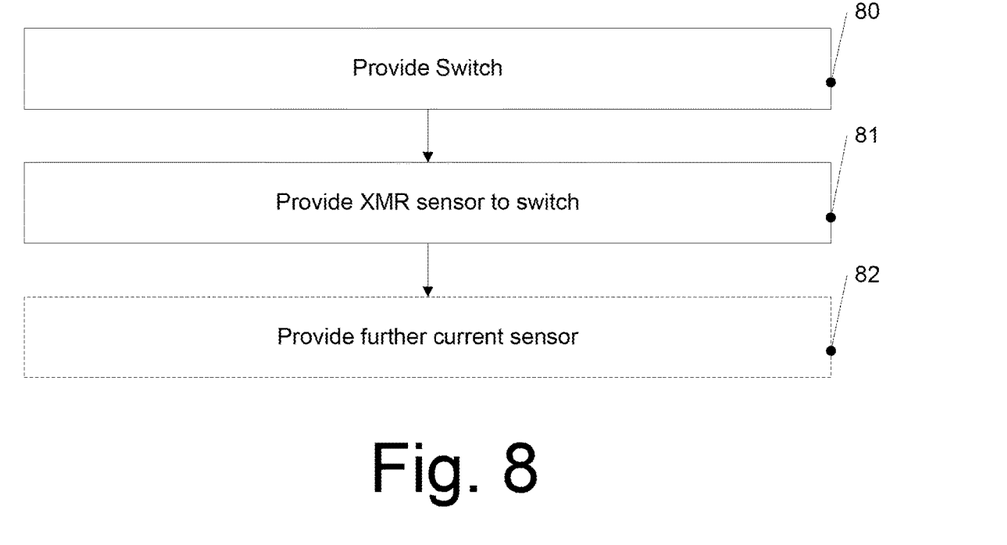
FIG. 8 is a flow chart illustrating a method according to an embodiment.

FIG. 8 is a flow chart showing a method according to an embodiment. The embodiment of FIG. 7 may be used to provide any of the devices discussed with reference to FIGS. 1-7, but may also be used independently therefrom. Any modifications and variations described with respect to the switch devices of FIGS. 1-7 may also be applied to the method of FIG. 8. While the method of FIG. 8 is shown as and will be described as a series of acts or events, the order in which these acts or events are shown and described is not to be construed as limiting, and other orders are also possible.

At 80 in FIG. 8, the method comprises providing a switch, for example a switch transistor like a MOSFET, an IGBT, or a bipolar transistor. At 81, the method comprises providing at least one XMR sensor to the switch, arranged to measure a current flowing through the switch. The XMR sensor may for example be provided with multiple taps, as illustrated in FIG. 6A, may be provided with a measurement range switching through different current or voltage sources, and/or more than one XMR sensor may be provided, for example to cover different measurement ranges. Optionally, at 82 a further current sensor, for example using a current mirror as illustrated in FIG. 5, circuit part 57, may be provided. In yet other embodiments, provision of a further current sensor may be omitted.

The method of FIG. 8 is merely an example, and other methods may also be provided. The switch device provided by the method of FIG. 8 may be operated as described above, for example for overcurrent/undercurrent detection or for aging detection.

Figure 9:
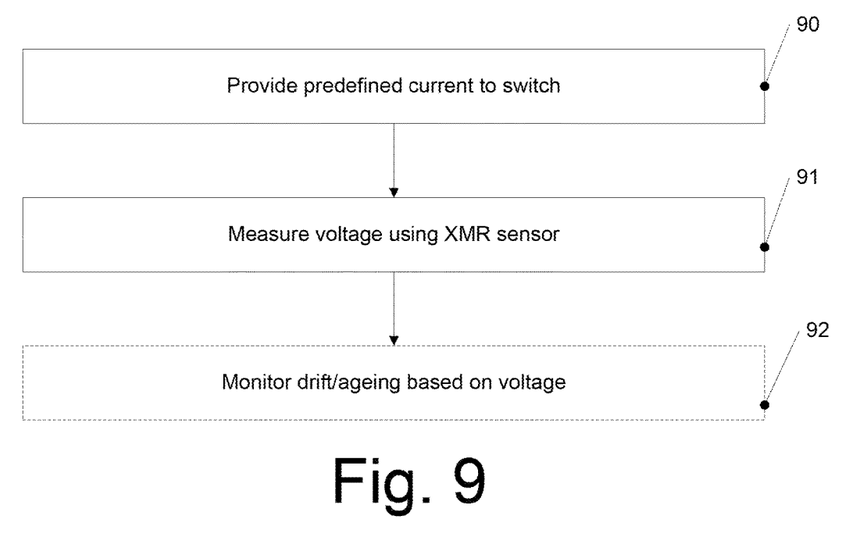
FIG. 9 is a flow chart illustrating a method according to a further embodiment.

FIG. 9 illustrates a flowchart of a method according to an embodiment for measuring a voltage as already explained above. At 90, a predefined current is applied to a switch. At 91, a voltage across the switch is measured using an XMR sensor, which provide galvanic separation, based on the change of a resistance of one or more magnetoresistive elements of the XMR sensor. At 92, optionally the voltage measurement may be used to determine drift or ageing, for example by monitoring a threshold voltage, as explained above.

According to some embodiments, the following examples are provided:

EXAMPLE 1

A device, comprising:
a switch (i.e. at least one switch) including a control terminal, a first load terminal and a second load terminal, and
a magnetoresistive sensor (i.e. at least one magnetoresistive sensor) configured to measure a current flowing between the first load terminal and the second load terminal.

EXAMPLE 2

The device of example 1, wherein the magnetoresistive sensor comprises a magnetoresistive sensor bridge.

EXAMPLE3

The device of example 1 or 2, further comprising a current mirror based sensor to measure the current between the first load terminal and the second load terminal.

EXAMPLE 4

The device of any one of examples 1-3, wherein the magnetoresistive sensor comprises a first magnetoresistive sensor and a second magnetoresistive sensor, the first and second magnetoresistive sensors being designed for different measurement ranges.

EXAMPLE5

The device of any one of examples 1-4, wherein the magnetoresistive sensor comprises a plurality of selectable taps.

EXAMPLE6

The device of example 5, wherein the taps are selectable to at least one of controlling an offset of the magnetoresistive sensor, to provide a calibration function or to provide a fuse function.

EXAMPLE7

The device of any one of examples 1-6, wherein the switch comprises a switch transistor.

EXAMPLE8

The device of any one of examples 1-7, wherein the magnetoresistive sensor is based on at least one of a giant magnetoresistance, a tunneling magnetoresistance, a colossal magnetoresistance or an anisotropic magnetoresistance.

EXAMPLE9

The device of any one of examples 1-8, further comprising an evaluation circuit configured to monitor the switch based on an output of the magnetoresistive sensor.

EXAMPLE10

The device of example 9, wherein the evaluation circuit is configured to detect an overcurrent based on the output of the magnetoresistive sensor.

EXAMPLE11

The device of example 9 or 10, wherein the evaluation circuit is configured to detect an overtemperature based on an output of the magnetoresistive sensor.

EXAMPLE12

The device of any one of examples 9-11, wherein the evaluation circuit is configured to detect an aging based on an output of the magnetoresistive sensor.

EXAMPLE13

The device of any one of examples 9-12, wherein the evaluation circuit is configured to detect at least one of an on-state or an open load.

EXAMPLE14

The device of any one of examples 1-13, wherein the device is configured to measure a voltage across the switch using the magnetoresistive sensor.

EXAMPLE15

The device of any one of examples 1-14, wherein the magnetoresistive sensor is provided on a copper clip conducting the current.

EXAMPLE16

The device of any one of examples 1-5, further comprising a temperature sensor.

EXAMPLE17

A method, comprising:
providing a switch, and
providing a magnetoresistive sensor to measure a load current through the switch.

EXAMPLE18

The method of example 17, further comprising providing a sense transistor based further current sensor to measure the load current of the switch.

EXAMPLE19

The method of example 17 or 18, wherein providing the magnetoresistive sensor comprises providing the magnetoresistive sensor with a switchable measurement range.

EXAMPLE20

A device, comprising:
a switch transistor,
a current sense transistor, commonly controlled with the switch transistor provided to mirror a current through the switch transistor,
a first magnetoresistive sensor bridge to measure a load current of the switch transistor, and
a second magnetoresistive sensor bridge to measure a load current through the switch transistor.

EXAMPLE21

A method, comprising:
applying a predetermined current to a switch, and
measuring a voltage across the switch using a magnetoresistive sensor.

EXAMPLE22

The method of example 21, further comprising determining a drift of a property of the switch based on the voltage measurement.

EXAMPLE23

The method of example 22, wherein the property comprises at least one of a threshold voltage of the switch or an on resistance of the switch.

EXAMPLE24

The method of any one of examples 21-23, further comprising monitoring operation of the switch based on an output of the magnetoresistive sensor.

The above described embodiments serve merely as illustrative examples and are not to be construed as limiting.

What is claimed is:
1. A device comprising:
a switch including a control terminal, a first load terminal, and a second load terminal,
an amplifier,
a magnetoresistive sensor bridge comprising a plurality of magnetoresistive sensors and configured to measure a current flowing between the first load terminal and the second load terminal, wherein a first magnetoresistive sensor of the plurality of magnetoresistive sensors includes a plurality of selectable taps along the first magnetoresistive sensor, and wherein the plurality of selectable taps are switchable to couple to the amplifier, and
a current mirror based sensor to measure the current between the first load terminal and the second load terminal.
2. The device of claim 1, wherein the plurality of magnetoresistive sensors further comprises a second magnetoresistive sensor, wherein the first magnetoresistive sensor and the second magnetoresistive sensor are configured for different measurement ranges.
3. The device of claim 1, wherein the plurality of selectable taps are selectable to at least one of controlling an offset of the magnetoresistive sensor bridge, to provide a calibration function, or to provide a fuse function.
4. The device of claim 1, wherein the switch comprises a switch transistor.

5. The device of claim 1, wherein the magnetoresistive sensor bridge is based on at least one of a giant magnetoresistance, a tunneling magnetoresistance, a colossal magnetoresistance or an anisotropic magnetoresistance.

6. The device of claim 1, further comprising an evaluation circuit configured to monitor the switch based on an output of the magnetoresistive sensor bridge.

7. The device of claim 6, wherein the evaluation circuit is configured to detect an overcurrent based on the output of the magnetoresistive sensor bridge.

8. The device of claim 6, wherein the evaluation circuit is configured to detect an overtemperature based on an output of the magnetoresistive sensor bridge.

9. The device of claim 6, wherein the evaluation circuit is configured to detect an aging based on an output of the magnetoresistive sensor bridge.

10. The device of claim 6, wherein the evaluation circuit is configured to detect at least one of an on-state or an open load.

11. The device of claim 1, wherein the device is configured to measure a voltage across the switch using the magnetoresistive sensor bridge.

12. The device of claim 1, wherein the magnetoresistive sensor bridge is provided on a copper clip conducting the current.

13. A method comprising:
    providing a switch that comprises a control terminal, a first load terminal, and a second load terminal, and
    providing a magnetoresistive sensor bridge comprising a plurality of magnetoresistive sensors to measure a load current through the switch between the first load terminal and the second load terminal,
    providing a plurality of selectable taps along a first magnetoresistive sensor of the plurality of magnetoresistive sensors, wherein the plurality of selectable taps are switchable to couple to an amplifier, and
    providing a current mirror based sensor to measure the load current through the switch between the first load terminal and the second load terminal.

14. The method of claim 13, wherein providing the magnetoresistive sensor bridge comprises providing the magnetoresistive sensor bridge with a switchable measurement range.

15. A method comprising:
    applying a predetermined current to a switch,
    measuring a voltage across the switch using a magnetoresistive sensor bridge comprising a plurality of magnetoresistive sensors, wherein measuring the voltage comprises selecting a tap of a plurality of taps along a first magnetoresistive sensor of the plurality of magnetoresistive sensors, wherein the plurality of selectable taps are switchable to couple to an amplifier, and
    determining a drift of at least one of a threshold voltage of the switch or an on resistance of the switch based on the voltage measurement.

16. The method of claim 15, further comprising monitoring operation of the switch based on an output of the magnetoresistive sensor bridge.

17. The device of claim 1, wherein the amplifier comprises a differential amplifier including:
    a first input node configured to selectively couple to a first tap of the plurality of selectable taps or a second tap of the plurality of selectable taps; and
    a second input node coupled to a second node on the magnetoresistive sensor bridge,
    wherein the plurality of selectable taps are switchable to couple to the first input node.

18. The device of claim 17, further comprising an evaluation circuit configured to monitor the switch based on an output of the differential amplifier.

19. The method of claim 15, wherein the amplifier comprises a differential amplifier, the method further comprising monitoring operation of the switch based on an output of the differential amplifier, wherein the differential amplifier includes:
    a first input node selectively coupled to a first tap or a second tap of the plurality of selectable taps; and
    a second input node coupled to a second node on the magnetoresistive sensor bridge.

20. A device comprising:
    a switch including a control terminal, a first load terminal, and a second load terminal;
    a magnetoresistive sensor bridge comprising a first branch connected in parallel with a second branch,
    wherein the first branch comprises a first magnetoresistive sensor connected in series with a second magnetoresistive sensor,
    wherein second branch comprises a third magnetoresistive sensor connected in series with a fourth magnetoresistive sensor,
    wherein the magnetoresistive sensor bridge is configured to measure a current flowing between the first load terminal and the second load terminal,
    wherein a first magnetoresistive sensor of the plurality of magnetoresistive sensors includes a plurality of selectable taps along the first magnetoresistive sensor; and
    a current mirror based sensor to measure the current between the first load terminal and the second load terminal.

* * * * *